Aug. 18, 1953 B. L. HAVENS Re. 23,699

PULSE DELAY CIRCUIT

Original Filed July 30, 1951

INVENTOR.

BYRON L. HAVENS

BY Albert R. Hodges

ATTORNEY

Reissued Aug. 18, 1953 Re. 23,699

UNITED STATES PATENT OFFICE 23,699

PULSE DELAY CIRCUIT

Byron L. Havens, Bergen County, N. J., assignor to International Business Machines Corporation, New York, N. Y., a corporation of New York Original No. 2,624,839, dated January 6, 1953, Serial No. 239,370, July 30, 1951. Application for reissue February 11, 1953, Serial No. 336,464

15 Claims. (Cl. 250—27)

Figure 2:
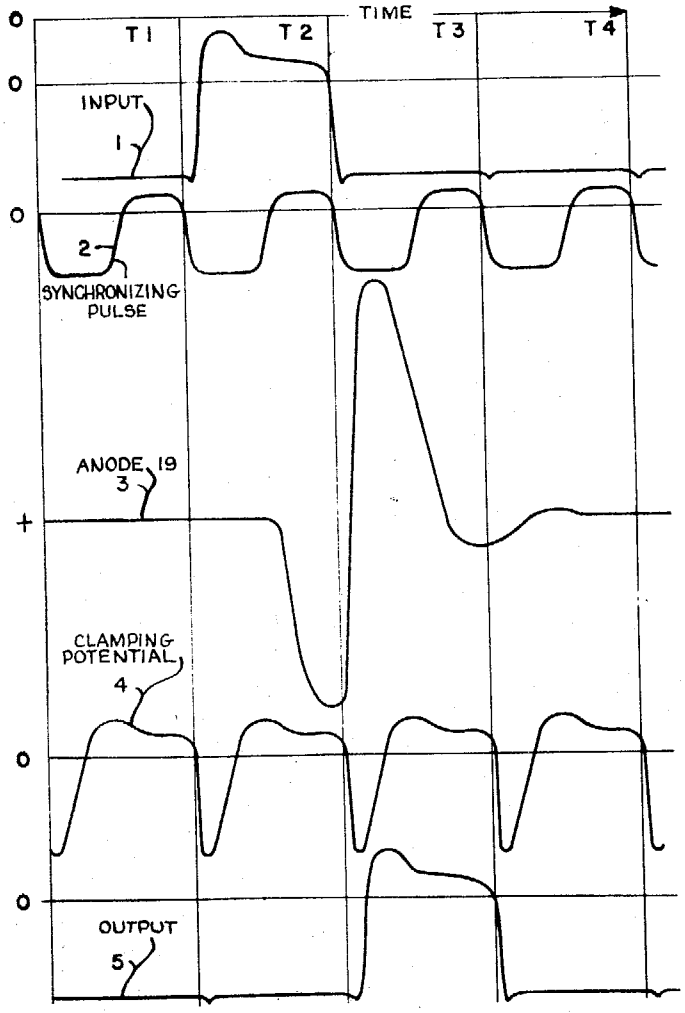

Matter enclosed in heavy brackets [ ] appears in the original patent but forms no part of this reissue specification; matter printed in italics indicates the additions made by reissue.

This invention relates to pulse delay circuit arrangements, and more particularly to improvements over the delay circuit disclosed and claimed in copending application Serial No. 262,732, filed December 21, 1951 as a division of application Serial No. 47,626 of Byron L. Havens, filed September 3, 1948, and assigned to the same assignee as the present application.

Pulse delay circuit arrangements of the type herein contemplated are particularly useful where the input signal comprises a coded pulse train in which the pulses occur during uniform time intervals, and where it is desired to shift each such pulse into a subsequent time interval. Pulse delay circuits of this type are especially useful, for example, in electronic computers, in which the input signal comprises a series of pulses representing binary digits.

It is a principal object of the present invention to provide an improved pulse delay circuit arrangement of relatively compact and inexpensive construction.

Another object of the present invention is to provide a pulse delay circuit arrangement which does not place stringent requirements regarding impedance, wave shape or uniformity of magnitude on the signal and synchronizing pulse sources.

An additional object of the present invention is to provide a pulse delay circuit arrangement which can receive a second input pulse while producing an output pulse corresponding to a first input pulse, without interaction therebetween.

Still another object of the present invention is to provide a pulse delay circuit arrangement which furnishes an output pulse having a readily usable waveform.

In accordance with the present invention, there is provided a pulse delay circuit arrangement which comprises a combination of components including first and second input terminals [means for developing] *for applying* a positive-going pulse *to the control electrode of an electron discharge device* when positive pulses are applied to both of the input terminals. [, and an electron discharge device having a control electrode, a cathode and an anode. Means are provided for applying a positive-going pulse to the control electrode. There are provided positive and negative potential sources having a common terminal, this terminal being connected to the cathode.] A load impedance, preferably having a reactive component, is connected between the anode and *a* [the] positive potential source. A series network comprising a plurality of rectifier elements is connected between [the] *a* negative potential source and a source of clamping potential. A series network comprising a plurality of impedance elements is connected between the anode and the negative potential source, the junction of a pair of these impedance elements being connected to the junction of a first pair of the rectifier elements. An output terminal is connected to the junction of a second pair of rectifier elements.

In accordance with an additional feature of the present invention, the means for developing a positive-going pulse when positive pulses are applied to both of the input terminals comprises rectifiers connected in series respectively with the two input terminals, these rectifiers *are* [preferably being] arranged to offer minimum resistance to current flow toward the input terminals. This portion of the circuit may be referred to as an "and" circuit.

In accordance with another important feature of the present invention, the clamping potential may have a predetermined phase relationship with respect to the pulse applied to one of the input terminals. Such pulses may be designated synchronizing pulses and may occur periodically at uniformly spaced intervals corresponding with the time intervals of the pulse train applied to the signal input terminal.

Other objects of the invention will be pointed out in the following description and claims and illustrated in the accompanying drawings, which disclose by way of example, the principle of the invention and the best mode, which has been contemplated, of applying that principle.

Figure 1:
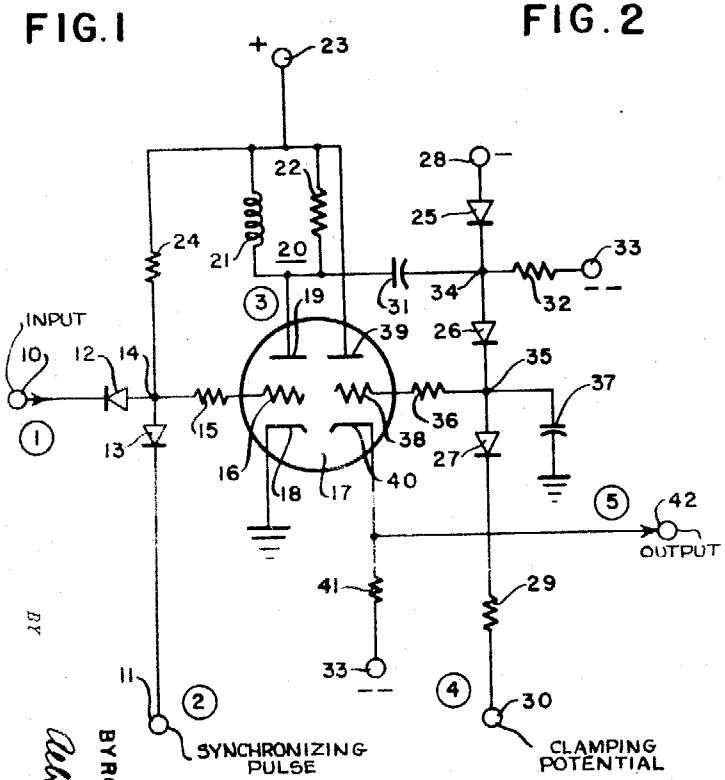

In the drawing:

Fig. 1 is a schematic circuit diagram of a pulse delay circuit arrangement in accordance with a preferred embodiment of the present invention; and Fig. 2 is a graphical representation, to a common time base, of the approximate waveforms which exist in various portions of the system of Fig. 1, these portions being designated by the encircled reference numerals.

Referring to Fig. 1 of the drawing, there are shown input terminals 10 and 11, to which are applied respectively *input* signal pulses (curve 1) and synchronizing pulses (curve 2). For the purpose of developing a positive-going pulse when positive pulses are applied to both of input terminals 10 and 11, there are provided rectifiers 12 and 13 connected respectively between a junction 14 and input terminals 10 and 11, and [preferably] arranged so that they offer minimum resistance to current flow toward these input terminals.

A resistor 15 is connected between junction 14 and the left-hand control electrode 16 of an electron discharge device 17, which is *shown as a* [preferably of the] dual triode. [type.] Left-hand cathode 18 of discharge device 17 is grounded, and left-hand anode 19 of discharge device 17 is connected through a load impedance 20 comprising an inductor 21 shunted by a resistor 22 to positive potential terminal 23. A *load* resistor 24 is connected between junction 14 and positive potential terminal 23. *Load resistor 24 and rectifiers 12 and 13 comprise an "and" circuit.*

There is provided a series network comprising a plurality of rectifier elements 25, 26 and 27 connected between negative potential terminal 28 and, through a resistor 29, a source of clamping potential 30. The waveform of this potential is indicated by curve 4 (Fig. 2). Rectifier elements 25, 26 and 27 are [preferably] arranged to offer minimum resistance to current flow from negative potential terminal 28 to clamping potential source 30.

A series network comprising a plurality of impedance elements including capacitor 31 and resistor 32 is connected between left-hand anode 19 of discharge device 17 and negative potential terminal 33, junction 34 between elements 31 and 32 being common with the junction between rectifier elements 25 and 26.

Junction 35 between rectifier elements 26 and 27 may be connected to an output terminal 43 of the delay circuit arrangement itself. A series network comprising resistor 36 and capacitor 37 is connected between right-hand control electrode 38 of discharge device 17 and ground, the junction between impedance elements 36 and 37 being connected to junction 35. Right-hand anode 39 of discharge device 17 is connected to positive potential terminal 23, and right-hand cathode 40 of discharge device 17 is connected through an impedance element or resistor 41 to negative potential terminal 33, an output terminal 42 being also connected to cathode 40. Resistors 15 and 36 serve to prevent any parasitic oscillations which might otherwise occur.

It will be understood, of course, that all the necessary supply voltages to the pulse delay circuit arrangement of Fig. 1 may be supplied from positive and negative potential sources having a common terminal, this common terminal being grounded, the ungrounded terminal of the positive potential source being connected to terminal 23, the ungrounded terminal of the negative potential source being connected to terminal 33, and terminal 28 being connected to any suitable tap on the negative potential source. This is in accordance with conventional practice.

In operation, let it first be assumed that no *input* signal and synchronous pulses are present at input terminals 10 and 11. Under this condition, these terminals are sufficiently negative with respect to ground so that the left-hand portion of discharge device 17 is non-conductive. Hence left-hand anode 19 is substantially at the potential of positive potential terminal 23, and capacitor 31 is charged due to the difference in potential between positive potential terminal 23 and negative potential terminal 33, junction 34 being held at a potential no more negative than negative potential terminal 28 due to the presence of rectifier element 25. Junction 35 is maintained at a negative potential relative to ground due to the application of the clamping potential (curve 4) at terminal 30 through resistor 29 and rectifier element 27, and the resultant charge on capacitor 37. This in turn causes the right-hand portion of discharge device 17, which operates as a cathode follower, to have relatively low conductivity, so that right-hand cathode 40, and hence output terminal 42, is negative with respect to ground. This condition is depicted in the first half of time interval T1 of Fig. 2 of the drawing.

Let it now be assumed that a synchronous pulse (curve 2) is applied to input terminal 11. Due to the action of rectifier element 12, junction 14 cannot be more than negligibly positive with respect to input terminal 10, so the left-hand portion of discharge device 17 remains non-conductive and no output pulse is produced. This condition is illustrated by the second half of time interval T1 of Fig. 2. Similarly, the presence of a positive-going signal pulse (curve 1) on input terminal 10, in itself, is incapable of rendering the left-hand portion of discharge device 17 conductive to produce an output pulse, as shown in the first half of time interval T2 of Fig. 2.

When positive-going pulses are present simultaneously on input terminals 10 and 11 as shown in the second half of time interval T2 of Fig. 2, however, junction 14 becomes positive *to thereby provide an input to the control grid 16* and the left-hand portion of discharge device 17 becomes conductive. This produces a negative-going pulse (curve 3) at left-hand anode 19, in turn causing the discharge of capacitor 31, the potential of junction 34 remaining substantially unchanged. At the approximate time when the synchronous pulse (curve 2) ends, the positive-going edge of the pulse (curve 3) at anode 19 causes a positive-going pulse to pass through capacitor 31 and through rectifier element 26 to junction 35, thereby raising the potential of this junction in a positive direction and correspondingly charging capacitor 37. The right-hand portion of discharge device 17 thus is rendered substantially more conductive, so that a positive-going output pulse (curve 5) is developed at cathode 40 and output terminal 42. As illustrated in time interval T3 of Fig. 2, this condition is maintained until the next clamping potential pulse (curve 4) is applied in time interval T4.

It will be apparent from the above description of the operation of the circuit that an input pulse appearing at any given time interval causes an output pulse to be produced in the succeeding time interval. It will also be apparent that an input pulse may be received in one time interval simultaneously with the production of an output pulse corresponding to an input pulse received during the preceding time interval, without interaction therebetween.

In one particular embodiment of the present invention which was specifically designed for operation in, and which operated successfully in, a system employing time intervals having a duration of one microsecond and in which each signal pulse occupies at least the last one-third of its time interval, the following values of constants and components were utilized:

| | |
|---|---|
| Resistors 15 and 36 | 330 ohms. |
| Resistors 22 and 41 | 8,200 ohms. |
| Resistor 24 | 8,200 ohms. |
| Resistor 29 | 1,200 ohms. |

| | |
|---|---|
| Resistor 32 | 180,000 ohms. |
| Capacitor 31 | 68 micromicrofarads. |
| Capacitor 37 | 22 micromicrofarads. |
| Inductor 21 | 0.75 millihenry. |
| Rectifiers 12, 13, 25, 26 and 27. | Type 1N45. |
| Discharge device 17 | Type 12AV7. |
| Potential terminal 23 | +150 volts. |
| Potential terminal 28 | −30 volts. |
| Potential terminal 33 | −82 volts. |

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A pulse delay circuit arrangement comprising the combination of: first and second input terminals; means for developing a positive-going pulse when positive pulses are applied to both said input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

2. A pulse delay circuit arrangement comprising the combination of: first and second input terminals; means for developing a positive-going pulse when positive pulses are applied to both said input terminals, said means comprising first and second rectifiers connected respectively in series with said first and second input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

3. A pulse delay circuit arrangement comprising the combination of: first and second input terminals; means for developing a positive-going pulse when positive pulses are applied to both said input terminals, said means comprising first and second rectifiers connected respectively in series with said first and second input terminals and offering minimum resistance to current flow toward said input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

4. A pulse delay circuit arrangement comprising the combination of: first and second input terminals; means for developing a positive-going pulse when positive pulses are applied to both said input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential, said clamping potential having a predetermined phase relationship to the positive pulses applied to one of said input terminals; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

5. A pulse delay circuit arrangement comprising the combination of: first and second input terminals; means for developing a positive-going pulse when positive pulses are applied to both said input terminals; an electron discharge device having a control electrode, a cathode and an anode; means for applying said positive-going pulse to said control electrode; a load impedance having a reactive component connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

6. A pulse delay circuit arrangement comprising the combination of: first and second input terminals; means for developing a positive-going pulse when positive pulses are applied to both said input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential; a series network comprising a pair of impedance elements connected at one end to said anode and at the other end to a potential negative with respect to said anode potential, one of said impedance elements being capacitively reactive and the junction of said impedance elements being connected to the junction of a first pair of said rectifier elements; and an output terminal connected to the junction of a second pair of said rectifier elements.

7. A pulse delay circuit arrangement comprising the combination of: first and second input terminals; means for developing a positive-going pulse when positive pulses are applied to both said input terminals; an electron discharge device having a control electrode, a cathode and an anode; means for applying said positive-going pulse to said control electrode; a load impedance connected between said anode and a source of anode potential; means for supplying said cathode with a potential negative with respect to said anode potential; a series network comprising a plurality of rectifier elements connected at one end to a potential negative with respect to said anode potential and at the other end to a source of clamping potential, said rectifier elements offering minimum resistance to current flow toward said source of clamping potential; a series network comprising a pair of impedance elements connected at one end to said anode and at the other end to a potential negative with respect to said anode potential, the junction of said impedance elements being connected to the junction of a first pair of said rectifier elements; and an output terminal connected to the junction of a second pair of said rectifier elements.

8. A pulse delay circuit arrangement comprising the combination of: a first electron discharge device having a control electrode; a cathode and an anode; an input terminal connected to said control electrode; positive and negative potential sources having a common terminal, said common terminal being connected to said cathode and said negative potential source having taps thereon; a load impedance connected between said anode and said positive potential source; a series network comprising first, second and third rectifier elements connected between a tap on said negative potential source and a source of clamping potential; a series network comprising first and second impedance elements connected between said anode and a tap on said negative potential source, the junction of said first and second impedance elements being connected to the junction of said first and second rectifier elements; a second electron discharge device having a control eletrode, a cathode and an anode, said anode being connected to said positive potential source; a series network comprising third and fourth impedance elements connected between said last-mentioned control electrode and said common terminal, the junction of said third and fourth impedance elements being connected to the junction of said second and third rectifier elements; a fifth impedance element connected between said last-mentioned cathode and a tap on said negative potential source; and an output terminal connected to said last-mentioned cathode.

9. A pulse delay circuit arrangement comprising the combination of: a first electron discharge device having a control electrode, a cathode and an anode; an input terminal connected to said control electrode; positive and negative potential sources having a common terminal, said common terminal being connected to said cathode and said negative potential source having taps thereon; a load impedance having a reactive component connected between said anode and said positive potential source; a series network comprising first, second and third rectifier elements connected between a tap on said negative potential source and a source of clamping potential; a series network comprising first and second impedance elements connected between said anode and a tap on said negative potential source, the junction of said first and second impedance elements being connected to the junction of said first and second rectifier elements; a second electron discharge device having a control electrode, a cathode and an anode, said anode being connected to said positive potential source; a series network comprising third and fourth impedance elements connected between said last-mentioned control electrode and said common terminal, the junction of said third and fourth impedance elements being connected to the junction of said second and third rectifier elements; a fifth impedance element connected between said last-mentioned cathode and a tap on said negative potential source; and an output terminal connected to said last-mentioned cathode.

10. A pulse delay circuit arrangement comprising the combination of: a first electron discharge device having a control electrode, a cathode and an anode; an input terminal connected to said control electrode; positive and negative potential sources having a common terminal, said common terminal being connected to said cathode and said negative potential source having taps thereon; a load impedance connected between said anode and said positive potential source; a series network comprising first, second and third rectifier elements connected between a tap on said negative potential source and a source of clamping potential; a series network comprising first and second impedance elements connected between said anode and a tap on said negative potential source, said first impedance element being capacitively reactive and the junction of said first and second impedance elements being connected to the junction of said first and second rectifier elements; a second electron discharge device having a control electrode, a cathode and an anode, said anode being connected to said positive potential source; a series network comprising third and fourth impedance elements connected between said last-mentioned control electrode and said common terminal, said fourth impedance element being capacitively reactive and the junction of said third and fourth impedance elements being connected to the junction of said second and third rectifier elements; a fifth impedance element connected between said last-mentioned cathode and a tap on said negative potential source; and an output terminal connected to said last-mentioned cathode.

11. A pulse delay circuit arrangement comprising the combination of: a first electron discharge device having a control electrode, a cathode and an anode; an input terminal connected to said control electrode; positive and negative potential sources having a common terminal, said common terminal being connected to said cathode and said negative potential source having taps thereon; a load impedance connected between said anode and said positive potential source; a series network comprising first, second and third rectifier elements connected between a tap on said negative potential source and a source of clamping potential, said rectifier elements offering minimum resistance to current flow from said negative potential source to said source of clamping potential; a series network comprising first and second impedance elements connected between said anode and a tap on said negative potential source, the junction of said first and second impedance elements being connected to the junction of said first and second rectifier elements; a second electron discharge device having a control electrode, a cathode and an anode, said anode being connected to said positive potential source; a series network comprising third and fourth impedance elements connected between said last-mentioned control electrode and said common terminal, the junction of said third and fourth impedance elements being connected to the junction of said second and third rectifier elements; a fifth impedance element connected between said last-mentioned cathode and a tap on said negative potential source; and an output terminal connected to said last-mentioned cathode.

*12. In a device for receiving an input and providing an output simultaneously; an output terminal; input means including an "and" circuit for receiving a series of electrical manifestations, each occurring within a predetermined time interval; delay circuit means joining said input means and said output terminal for utilizing each said electrical manifestation to produce an electrical manifestation at said output terminal during the next succeeding time interval after said predetermined time interval, said means including a grid controlled cathode follower tube having its cathode connected to said output terminal and its control grid connected through a capacitor to ground.*

*13. A pulse delay circuit comprising; a discharge device including a control electrode, a cathode and an anode, and first potential means for applying predetermined potentials thereto; "and" circuit means for applying an input pulse to be delayed to said control electrode to render said device operable; series connected rectifiers joining a second potential source less positive than the potential applied to said anode and a source of clamping potential having a predetermined phase relationship to said input pulses; series connected elements joining said anode to a third source of potential less positive than said second source, a junction of said elements being connected to a junction of said rectifiers; and a capacitor connected to another junction of said rectifiers to produce a pulse at a predetermined time after occurrence of said input pulse.*

*14. The invention set forth in claim 13 including an output cathode follower having an input and an output terminal and a connection from the last-mentioned junction of said rectifiers to the input terminal thereof.*

*15. In an electronic circuit for producing an output pulse a predetermined time after receipt of an input pulse; an "and" circuit for applying an input pulse to said circuit when two pulses are applied simultaneously thereto; a first grid controlled tube connected to be operable to produce an output in response to each said input pulse; a second grid controlled tube operable as a cathode follower and having an output terminal connected to the cathode thereof and a capacitor coupling the control grid thereof to ground; and unidirectional current flow means connecting the control grid of said second tube to the output of said first tube.*

BYRON L. HAVENS.

References Cited in the file of this patent or the original patent

UNITED STATES PATENTS

| Number | Name | Date |
|---|---|---|
| 2,560,167 | Glenn | July 10, 1951 |